United States Patent [19]

Rastegar

[11] Patent Number: 5,428,632
[45] Date of Patent: Jun. 27, 1995

[54] CONTROL CIRCUIT FOR DUAL PORT MEMORY

[75] Inventor: Bahador Rastegar, Dallas, Tex.

[73] Assignee: SGS-Thomson Microelectronics, Inc., Carrollton, Tex.

[21] Appl. No.: 693,670

[22] Filed: Apr. 30, 1991

[51] Int. Cl.⁶ .............................................. G06F 11/10
[52] U.S. Cl. .................................................... 371/51.1
[58] Field of Search ........................................ 371/51.1

[56] References Cited

U.S. PATENT DOCUMENTS

| | | | |
|---|---|---|---|
| 4,483,003 | 11/1984 | Beal | 371/51.1 |
| 4,843,542 | 6/1989 | Dashiell et al. | 364/200 |
| 4,918,695 | 4/1990 | Scheuneman | 371/51.1 |
| 4,920,536 | 4/1990 | Hammond | 371/51.1 X |
| 4,977,498 | 12/1990 | Rastegar et al. | 364/200 |

Primary Examiner—Stephen M. Baker
Attorney, Agent, or Firm—Kenneth C. Hill; Lisa K. Jorgenson; Richard K. Robinson

[57] ABSTRACT

A memory device provides a control circuit attached to a parity bit position of a memory array. When a selected single bit within an array entry has its value changed without affecting the remaining bits of the entry, the control circuit senses the previous value of the parity bit and internally stores the complement of that value into the parity bit position for that entry. This complementing of the parity bit occurs during the same memory cycle in which the selected bit is changed. Complementing of the parity bit to ensure proper parity function occurs without communication off of the device, and so is completely transparent to the outside world.

20 Claims, 2 Drawing Sheets

CONTROL CIRCUIT FOR DUAL PORT MEMORY

CROSS TO RELATED APPLICATIONS

The present application contains subject matter in common with U.S. application Ser. No. 473,239, filed Jan. 31, 1990 titled DUAL-PORT CACHE TAG MEMORY, by A. Daly and R. Tuttle, with U.S. application Ser. No. 677,313, filed Mar. 29, 1991, now U.S. Pat. No. 5,339,322, titled PARITY DETECT CIRCUIT by B. Rastegar, and with U.S. application Ser. No. 694,451, filed concurrently herewith, now U.S. Pat. No. 5,319,368, titled CONTROL CIRCUIT FOR DUAL PORT MEMORY by B. Rastegar, all of which are assigned to the assignee hereof and incorporated by reference hereinto.

BACKGROUND OF THE INVENTION

1. Field of the Invention

The present invention relates generally to integrated circuit memory devices, and more specifically to a circuit and method for preventing false parity errors in certain types of memory devices.

2. Description of the Prior Art

As is well known, occasional errors can occur in data stored in semiconductor memory devices. These errors can be caused by, for example, the malfunction of marginal active devices in an integrated circuit chip, electronic perturbations such as caused by power supply problems, and events such as ionization caused by alpha particle strikes. In most cases, the occurrence of these errors is essentially random. One common method used to detect the occurrence of such random errors is the generation and detection of a parity bit.

In its most common form, 1 parity bit is provided for each eight data bits, or for some other relatively small group of bits. Parity is defined as being odd or even, with the parity bit being assigned a value of 1 or 0 so that the number of ones in the data-plus-parity bits is either odd or even according to the defined parity scheme. This parity scheme allows for the detection of single bit errors, but will not detect two bit errors. In addition, no error correction is provided. Such a single bit parity detection scheme provides a good tradeoff between low cost and adequate error protection for most applications. This is true primarily because of the high reliability of semiconductor memory devices.

One type of memory used in computer systems is a cache memory. This is a relatively small, fast memory which resides in the system between the central processor and main system memory. Cache memory includes data memory fields for storing data cached from system memory, and tag memory fields for storing the addresses corresponding to the data stored in the data cache. Like other memories, cache memories typically include parity checking.

Some cache tag memory devices, such as that described in the application entitled DUAL-PORT CACHE TAG MEMORY, cited above, have two ports which can access a memory array asynchronously. In devices designed specifically for use as cache tag memories, one of the data ports can write data to a single bit of an entry in the array. This can cause the parity checking scheme to fail, since changing the value of a single bit would require the value of the parity bit to also be changed. In order to avoid this problem, it is possible to leave the single changeable bit out of the parity checking scheme, but this is undesirable since it does not provide for full parity checking of the memory.

In a dual port memory in which one port can change the value of a single bit of an entry in the memory, it would be desirable to provide a means for properly adjusting the parity bit of the entry so that parity checking remains valid, so that such single changeable bit can be included in the protection offered by the parity checker.

SUMMARY OF THE INVENTION

It is therefore an object of the present invention to provide a circuit for selectively writing values to a parity bit within semiconductor memory devices.

It is another object of the present invention to provide such a circuit which is suitable for use in cache tag memory devices.

It is a further object of the present invention to provide such a circuit which provides for the placement of correct parity values into the array after one port of a dual port memory device has changed the value of a single bit within one entry.

Therefore, in accordance with the present invention, a memory device provides a control circuit attached to a parity bit position of a memory array. When a selected single bit within an array entry has its value changed without affecting the remaining bits of the entry, the control circuit senses the previous value of the parity bit and internally stores the complement of that value into the parity bit position for that entry. This complementing of the parity bit occurs during the same memory cycle in which the selected bit is changed. Complementing of the parity bit to ensure proper parity function occurs without communication off of the device, and so is completely transparent to the outside world.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
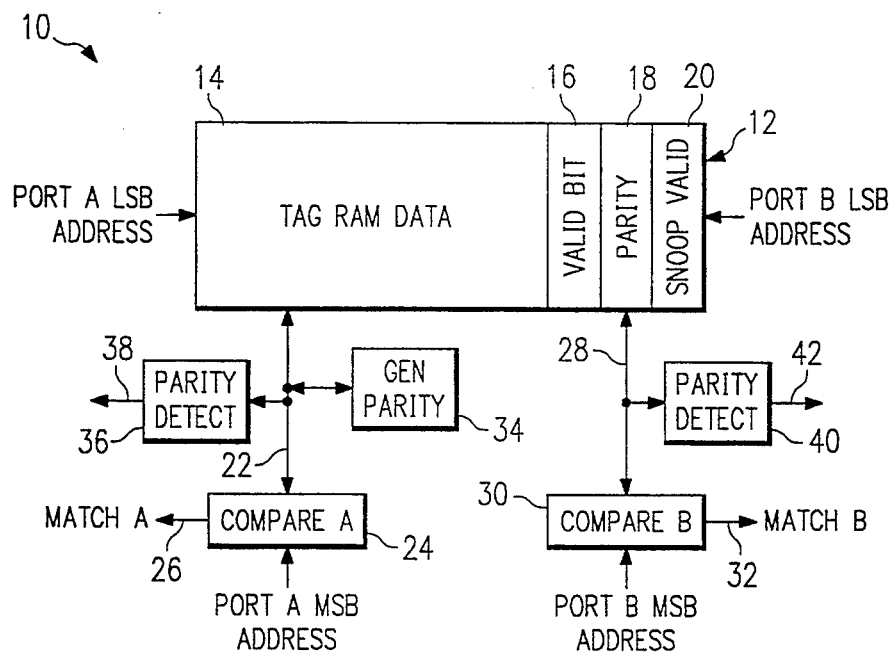
FIG. 1 is a block diagram of a cache tag memory which can utilize a control circuit according to the present invention.

FIG. 1 is a block diagram of a cache tag memory for use in which the parity checking scheme of the present invention is suitable. The device 10 of the preferred embodiment is a dual port cache tag memory suitable for use in a computer caching system. This device contains a bit, referred to as a snoop valid bit, for each entry in the memory. The snoop valid bit is reset to indicate that an entry is no longer valid whenever another device in the system, other than a local processor, writes data to a memory location which is stored in the cache. Additional details of such a cache tag memory, and its use in a multiprocessor computer system, are described in co-pending U.S. patent application Ser. No. 473,239, filed Jan. 31, 1990, and entitled DUAL-PORT CACHE TAG MEMORY, which has been incorporated hereinto by reference.

The device 10 includes a memory array 12. In the preferred embodiment, the memory array 12 is 12 bits wide, but it will be appreciated by those skilled in the art that various sized arrays 12 may be used in accordance with the principles of the present invention.

In the preferred embodiment, 9 bits of tag data 14 are stored for each entry in the array. Each entry in the array 12 also includes a valid bit 16, a parity bit 18, and a snoop valid bit 20.

The valid bit 16 is used by the system to reset the entire memory array 14. Whenever an entry has a value of 0 in the valid bit field 16, that entry is considered to be invalid. According to principles known in the art, clearing of the entire memory array 12 is accomplished by simultaneously resetting all of the valid bits 16 for all entries in the array, thereby invalidating all cache entries in a single memory cycle. This operation is often referred to as a "flash clear". None of the memory locations in the tag data field 14 are reset when the memory is cleared.

In the illustration of FIG. 1, the memory array 12 is a dual-port memory. This means that it may be accessed simultaneously and asynchronously by two different ports. Port A is connected to a local processor and is addressed by the local processor to determine whether a memory location to be accessed is contained within the cache memory. Port B is connected to a system bus and is used by the device 10 to "snoop" data being written on the system bus.

To determine whether an address being accessed by the local processor is contained within the data cache, the least significant bits of the local address are applied to Port A of the memory array 12, as known in the art. The number of least significant address bits which are used to index into the array 12 is determined by the number of entries in the array 12. When an entry is addressed by the Port A least significant address bits, the tag data field 14 contains the most significant bits of the address location stored at the corresponding location in the data cache (not shown). These most significant bits are read out of the memory array 12 on signal lines 22, and compared in comparator 24 to the most significant bits of the Port A address. If the most significant bits of the Port A address match the data on signal lines 22, then the data of the memory location being addressed on Port A currently resides in the data cache corresponding to the device 10. The indication of whether or not such a match exists is generated on signal line 26. If either the valid bit 16 or the snoop valid bit 20 have a value of 0, the entry is invalid and a miss is signalled on line 26.

The same process works for addresses connected to the device 10 through Port B, which are coming from the system bus. The least significant bits of the Port B address are applied to the memory array 12, and the corresponding tag data field 14 is read out on signal line 28. As is the case with signal lines 22, signal line 28 represents a number of individual lines equal to the number of bits in the tag data field 14, plus the valid bit, parity bit, and snoop valid bit. The value on signal line 28 is compared to the most significant bits of the Port B address in a comparator 30, and a signal indicative of whether or not a match is found is generated on signal line 32. As before, no match is signalled if either of the valid or snoop valid bits have a value of 0. In the case of Port B, if a match is found in comparator 30, the snoop valid bit 20 corresponding to the entry addressed by the least significant of the Port B address is reset to a value of 0.

Whenever a new value is stored into the memory array 12 from Port A, corresponding to loading a new memory location into the cache memory, parity generator 34 generates the appropriate parity bit corresponding to the remaining bits. Whenever an entry is written into the memory 12 the snoop valid bit 20 for that entry is always set to a value of 1. The valid bit 16 is generally set to a 1 by the user when writing a new entry into the array 12, unless some special condition warrants otherwise. New entries can be written into the memory array 12 only through Port A, which is the port connected to the local processor.

When a comparison is being made through Port A, a parity detect circuit 36 reads all of the bits of the entry, including the valid bit 16, parity bit be, and snoop bit 20, and generates a signal on line 38 indicating whether parity is valid for that entry. If a parity error occurs, various recovery techniques can be performed by the system.

Since data can be written into the memory array 12 only through Port A, no parity generation circuitry is required for Port B. However, a parity detect circuit 40 is required to check the parity for entries which are addressed through Port B. A signal is then put on line 42 to indicate whether parity is valid for an entry addressed through Port B.

Port B is used to "snoop" main memory locations being accessed on the system bus. Each time a memory location is accessed on the system bus, the corresponding entry is read from memory array 12 and compared to the most significant bits of the address. If a match is found, then a memory location being accessed over the system bus is stored in the local processor cache.

If a read operation is being performed on the system bus (port B), no conflicts arise and nothing is done within the cache tag memory. However, if data is being written to the matching main memory location on the system bus, then the data stored in the cache memory is no longer valid. In this instance the snoop valid bit for the entry selected through Port B is reset to the value of 0. This 0 value indicates that the entry is invalid, and such entry will generate a cache miss when later accessed through either Port A or Port B. This resetting of the snoop valid bit is the only situation in which Port B can write data to the memory array 12.

When the snoop valid bit 20 for an entry is reset to 0, the parity of that entry changes. Since only one bit has been changed, parity for that entry will now be detected as being incorrect, even though no actual parity error has occurred. In order to avoid the generation of such a false parity error, it is necessary to also simultaneously change the value of the parity bit for the entry to its complementary value. This allows the parity detect circuits 36 and 40 to continue to generate valid parity signals even after a snoop hit causes an entry to be invalidated by resetting its snoop valid bit 20.

Figure 2:
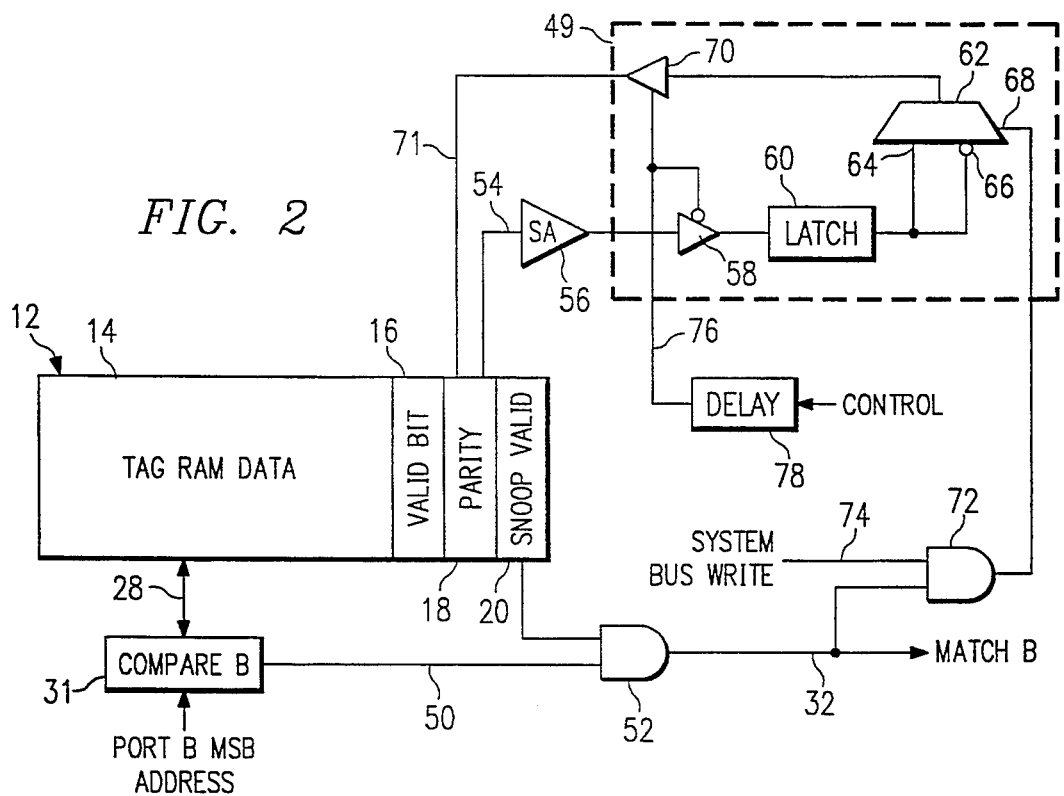
FIG. 2 is a block diagram illustrating a preferred control circuit for use with the cache tag memory of FIG. 1.

Referring to FIG. 2, a preferred circuit 49 is shown for complementing the parity bit and writing it back to the array 12 when the snoop valid bit is reset to 0. Comparator 31 compares the most significant bits of the Port B address with the tag data 14. Comparator 31 also checks the valid bit for an entry to ensure that it has a value of 1. The snoop valid bit 20 is combined with an output 50 of comparator 31 in an AND gate 52. The output of AND gate 52 forms the MATCH B signal on signal line 32.

Signal line 54 is connected to the parity bit line, and the value of the parity bit for the entry selected by the Port B least significant address bits will be present on signal line 54. Sense amplifier 56 is used to sense the value on the signal line 54. The output of sense amplifier 56 is connected to a gated buffer 58 within the control circuit 49. Buffer 58 is connected a latch 60, which is used to retain the value of the parity bit which is available on signal line 54.

The output of latch 60 is connected to a multiplexer 62 through a noninverting input 64 and an inverting input 66. The effect of multiplexer 62 is to select, based upon the value of a signal into its control input 68 either an inverted or noninverted value for the currently selected parity bit. The output of multiplexer 62 is connected to a gated buffer 70 which is used to write a value back into the parity bit on signal line 71.

The signal which is connected to the multiplexer control input 68 is generated by an AND gate 72. One input to AND gate 72 is taken from the output signal line 32. The second input to gate 72 is supplied on signal line 74. The system bus write signal on line 74 indicates that a write cycle is being performed on the system bus (port B), as opposed to a read cycle. As described above, the snoop valid bit 20 is only reset when both a match occurs, indicated by a logical 1 on signal line 32, and a system write cycle is occurring. Thus, when both lines 32 and 74 have a value of logical 1, the AND gate 72 provides a 1 input into control input 68. If either signal is 0, a logical 0 is presented to control input 68.

Buffers 58 and 70 are controlled by the signal presented on line 76. Signal line 76 is driven by delay circuit 78, which delays a control signal at its input. The control signal is one which indicates the completion of a system bus write cycle. The output of delay circuit 78 remains low whenever the system bus performs a read operation. During a system bus write, the signal on line 78 goes high for a short period at approximately the end of the system bus write cycle.

While the signal on line 76 is low, buffer 58 is enabled so that output of sense amp 56 is latched into the latch 60. At this time, buffer 70 is disabled, so that it does not affect the signal on line 54. When the signal on line 76 goes high buffer 58 is disabled so that the just read value on line 54 is latched into the latch 60. When line 76 goes high, buffer 70 is enabled, so that the output of multiplexer 62 is driven onto the signal line 71. The signal placed on line 71 will be the same as, or the complement of, the previous value stored in latch 60, depending upon the value of the control input into the multiplexer 62. As described above, the buffer 70 is not enabled during a system bus read cycle.

The multiplexer 62 is selected so that the noninverting input 64 is connected to the buffer 70 when a logical 0 is presented to its control input 68. This causes the same value previously stored in the parity bit for an entry to be rewritten into that entry when the memory entry does not match the most significant address bits. A 1 input into control input 68, indicating that a match has occurred during a system bus write, causes the inverted value of the parity bit to be connected to buffer 70, from where it is placed onto signal line 71. This causes the previous value of the parity bit for the selected entry, either a 1 or a 0, to be inverted under the desired conditions.

Figure 3:
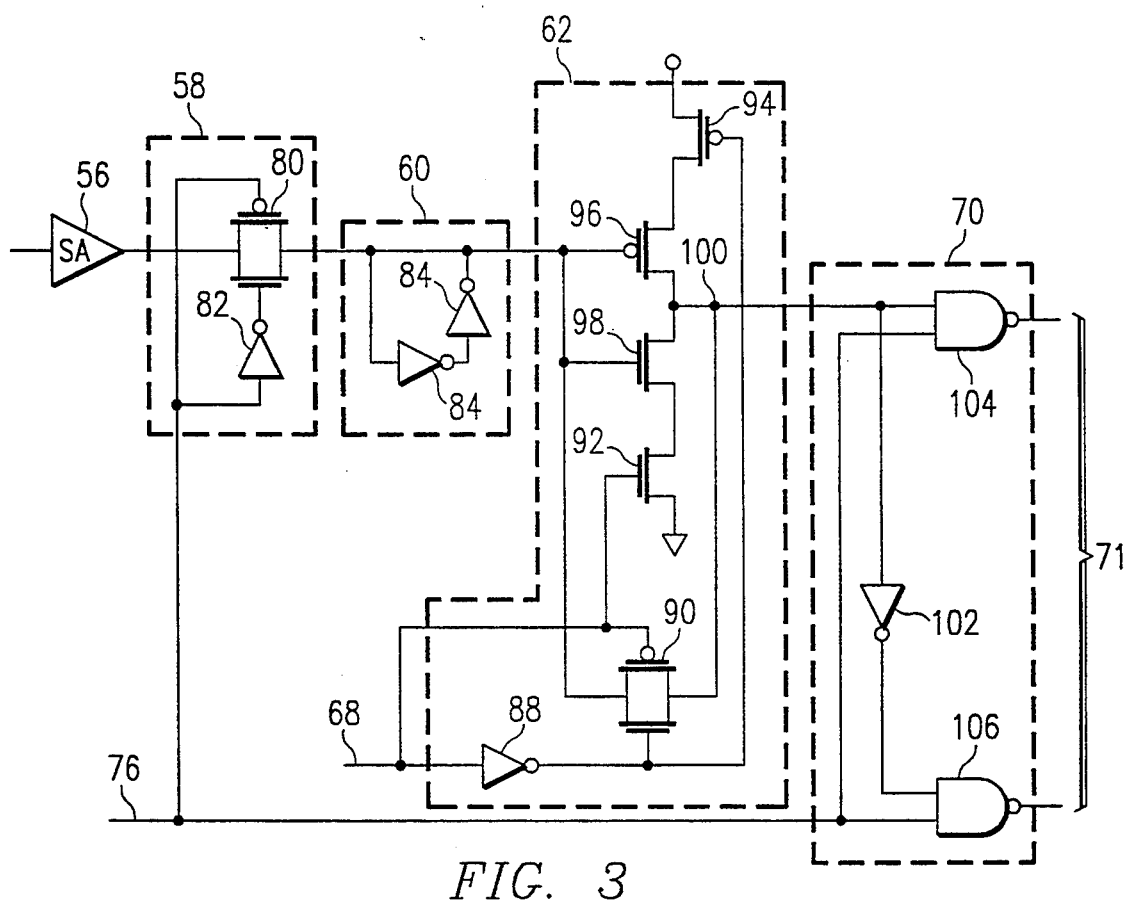
FIG. 3 is a more detailed schematic diagram of the preferred control circuit.

Referring to FIG. 3, a more detailed diagram is shown of the control circuit 49. Buffer 58 consists of a pass gate 80 and an inverter 82. A low value on signal line 76 causes the pass gate 80 to connect the output of sense amplifier 56 to the latch 60. When the signal on line 76 is high, the pass gate 80 acts as an open switch.

Latch 60 can be any type of latch, and is two inverters in a preferred embodiment. When the pass gate 80 is turned off, whatever value is present on node 86 will be retained in the latch 60.

Within the multiplexer 62, an inverter 88 inverts the signal available from the control input 68. The noninverted signal is connected to a pass gate 90 and an N-channel transistor 92. The output of inverter 88 is also connected to the pass gate 90 and to a P-channel transistor 94. Node 86 is connected to P-channel transistor 96 and N-channel transistor 98.

If the signal on line 68 is low, pass gate 90 will pass the value on node 86 directly to node 100. Transistors 92 and 94 are off, so that the node between transistors 96 and 98 floats and is driven to the value on node 100.

If signal line 68 is high, pass gate 90 is turned off. Transistors 92 and 94 are on, so that transistors 96 and 98 function as an inverter. This causes the complement of the value on node 86 to be placed onto node 100.

A preferred embodiment of the gated buffer 70 contains an inverter 102 and two NAND gates 104, 106. Signal line 76 is connected to both NAND gates 104, 106, and acts an enable signal. Inverter 102 inverts the signal on node 100, and applies it to an input of NAND 106. This causes the outputs of NAND gates 104, 106 to generate complementary signals when they are enabled by the signal on line 76 going high. As is known in the art, complementary values are used in SRAM memories to write data to bit cells in the array. The outputs from NAND gates 104 and 106 are returned to the array on signal lines 71 to write the appropriate value, inverted or noninverted, into the parity bit as described above.

It will be appreciated that the technique described above causes the parity bit to be automatically inverted when the value of a single bit within one entry in the array is changed. This ensures that parity detect circuitry continues to correctly detect valid parity. The invention has been described as implemented in a dual port cache tag memory, in which one port can invalidate a single snoop valid bit when a system write is performed to a main memory location which is cached in the memory. However, it will be appreciated by those skilled in the art that any type of memory which can toggle the value of a single bit of an entry without affecting the remaining bits can make use of this technique in order to provide a fully parity checked memory.

While the invention has been particularly shown and described with reference to a preferred embodiment, it will be understood by those skilled in the art that various changes in form and detail may be made therein without departing from the spirit and scope of the invention.

What is claimed is:

1. A control circuit for a dual port cache tag random access memory having a plurality of entries, each entry having a parity bit and a single selected bit, wherein a first port can change only the parity bit and the selected bit for an entry, comprising:
    a detector for indicating that the single bit in an addressed memory entry is changed;

a sensor for sensing a state of the parity bit for such an addressed entry; and a controller connected to said sensor and to said detector for, in response to a single bit in an addressed entry being changed, changing the state of the parity bit for such an entry;

wherein said controller writes a value into the parity bit for an addressed entry during every system write cycle, wherein the value so written is unchanged from its previous value if a cache miss occurred on the first port, and is complemented from its previous value if a cache hit occurred on the first port.

2. The control circuit of claim 1, wherein only one preselected bit of an entry can be changed without writing a new value to the entire entry.

3. The control circuit of claim 1, wherein the bit changeable by the first port has a value of 1 to indicate a valid entry, and is set to a value of 0 when a system address on the first port matches an array entry during a system write cycle.

4. The control circuit of claim 1, wherein a second port to the memory can write a new value to an entire entry.

5. The control circuit of claim 1, wherein said controller comprises:

means for latching a value detected by said sensor;

a logic circuit responsive to said detector for providing the latched value when the selected bit is not changed, and for providing the complement for the latched value when the selected bit is changed; and a write buffer for writing the provided value into the parity bit of the addressed entry.

6. The control circuit of claim 5, wherein said write buffer is enabled to write the provided value only during a write cycle for a bus memory attached to the first port.

7. The control circuit of claim 6, further comprising:

a delay means connected to said write buffer for delaying an enabling input thereto until the end of a system bus write cycle.

8. A method for retaining valid parity in a dual port memory device having first and second ports, and having a plurality of entries in an array and the capability for changing only the value of a single bit and a parity bit within a single selected entry of the array from the second port, comprising the steps of:

detecting the occurrence of a change of the single bit in an array entry by the second port;

when such a change is detected, complementing the parity bit for such array entry.

9. The method of claim 8, wherein said detecting step comprises the steps of:

determining the occurrence of a match between an array entry and a value on a system bus; and determining the occurrence of a system bus write cycle;

wherein the single bit is changed by the second port, and is detected to occur, in response to a match being determined to occur during a write cycle.

10. The method of claim 9, wherein said complementing step is performed at the end of a system bus write cycle.

11. The method of claim 9, further comprising the step of:

when a system write cycle occurs but there is no match with an array entry, writing the uncomplemented value of the parity bit back into the array entry.

12. A memory device, comprising:

a dual port memory array having a plurality of entries, each entry including a first bit and a parity bit;

a first port interface connected to the memory array for addressing the entries, and reading data from and writing data into addressed array entries;

a second port connected to the memory array for addressing the entries, and for, in response to a detected condition, writing a selected value into the first bit of an addressed entry;

a detector for indicating that the first bit in the entry addressed by the second port has been changed by the second port;

a sensor for sensing a state of the parity bit for the entry for which the first bit has been changed by the second port; and a controller connected to the sensor and the detector for, in response to the detector indicating that the first bit has been changed, changing the state of the parity bit for such an entry.

13. The memory device of claim 12, wherein the detected condition is a match between a data entry addressed by the second port and an address on a computer system bus during a system write cycle.

14. The memory device of claim 12, wherein said controller comprises:

means for latching a value detected by the sensor;

a logic circuit responsive to the detector for providing the latched value when the first bit is not changed, and for providing the complement for the latched value when the first bit is changed; and a write buffer for writing the provided value into the parity bit of the addressed entry.

15. The memory device of claim 14, wherein the write buffer is enabled to write the provided value only during a write cycle for a bus memory attached to the first port.

16. The memory device of claim 6, further comprising:

a delay means connected to the write buffer for delaying an enabling input thereto until the end of a system bus write cycle.

17. The memory device of claim 12, wherein the second port is capable of changing only the first bit and the parity bit for any entry.

18. The memory device of claim 17, wherein the memory is a cache tag memory.

19. The memory device of claim 18, wherein the first bit has a value of 1 to indicate a valid entry, and is set to a value of 0 when a system address on the second port matches an array entry during a system write cycle.

20. The memory device of claim 19, wherein the controller writes a value into the parity bit for an entry addressed by the second port during every system write cycle, wherein the value so written is unchanged from its previous value if a cache miss occurred on the second port, and is complemented from its previous value if a cache hit occurred on the second port.

* * * * *